(12) United States Patent
Volokhine et al.

(10) Patent No.: US 9,780,731 B2
(45) Date of Patent: Oct. 3, 2017

(54) HIGH FREQUENCY AMPLIFIER

(71) Applicants: Youri Volokhine, Plaisance du Touch (FR); Basim Noori, Gilbert, AZ (US)

(72) Inventors: Youri Volokhine, Plaisance du Touch (FR); Basim Noori, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/898,375

(22) PCT Filed: Jun. 27, 2013

(86) PCT No.: PCT/IB2013/001607
§ 371 (c)(1),
(2) Date: Dec. 14, 2015

(87) PCT Pub. No.: WO2014/207498
PCT Pub. Date: Dec. 31, 2014

(65) Prior Publication Data
US 2016/0142015 A1    May 19, 2016

(51) Int. Cl.
*H03F 3/191* (2006.01)
*H03F 1/02* (2006.01)
(Continued)

(52) U.S. Cl.
CPC ........... *H03F 1/0205* (2013.01); *H03F 1/565* (2013.01); *H03F 3/193* (2013.01); *H03F 3/195* (2013.01);
(Continued)

(58) Field of Classification Search
CPC ......... H01L 23/047; H01L 2224/49175; H01L 2224/48091; H01L 2924/13091;
(Continued)

(56) References Cited

U.S. PATENT DOCUMENTS 7,119,623 B2    10/2006 Blednov et al.
7,378,920 B2    5/2008 Jones et al.
(Continued)

FOREIGN PATENT DOCUMENTS

| JP | 10256850 | 9/1998 | |
| JP | 2007074072 | 3/2007 | |
| NL | EP 2747134 A1 * | 6/2014 | ............. H01L 23/66 |

OTHER PUBLICATIONS

International Search Report and Written Opinion correlating to PCT/IB2013/016007 issued on Mar. 27, 2014.

*Primary Examiner* — Steven J Mottola
*Assistant Examiner* — Hafizur Rahman

(57) ABSTRACT

A high frequency amplifier includes a high frequency amplifier transistor integrated in a first die of a first semiconductor technology and a matching circuit. The high frequency amplifier transistor has an input terminal, an output terminal and a reference terminal. The reference terminal is coupled to a reference potential. The matching circuit includes at least a first inductive bondwire, a second inductive bondwire and a capacitive element arranged in series with said inductive bondwires. The capacitive element is integrated in a second die of a second semiconductor technology different from the first semiconductor technology. The second semiconductor technology includes an isolating substrate for conductively isolating the capacitive element from a support attached at a first side to the second die. The capacitive element includes a first plate electrically coupled to a first bondpad of the second die and a second plate electrically coupled to a second bondpad of the second die.

22 Claims, 3 Drawing Sheets

(51) Int. Cl.
*H03F 1/56* (2006.01)
*H03F 3/195* (2006.01)
*H03F 3/193* (2006.01)

(52) U.S. Cl.
CPC .............. *H01L 2224/48091* (2013.01); *H01L 2224/48111* (2013.01); *H01L 2224/48137* (2013.01); *H01L 2224/49109* (2013.01); *H01L 2224/73265* (2013.01); *H03F 2200/387* (2013.01); *H03F 2200/451* (2013.01)

(58) Field of Classification Search
CPC ..... H01L 2924/1304; H01L 2924/1205; H01L 2924/1207; H01L 2924/1206; H01L 2924/00; H01L 25/50; H01L 25/165; H01L 28/20; H01L 28/40; H01L 21/565; H01L 238/3107; H01L 23/04; H01L 24/49; H01L 24/85; H01L 2924/3011; H01L 23/66; H03F 3/195; H03F 2200/451; H03F 2200/222; H03F 2200/387; H03F 1/565; H03F 3/21; H03F 3/191; H03F 1/56; H03F 3/505; H03F 1/306; H03F 3/1395
USPC ........ 330/250, 289, 300, 302, 307; 257/532; 332/32; 438/107
See application file for complete search history.

(56) References Cited

U.S. PATENT DOCUMENTS

| | | | |
|---|---|---|---|
| 7,936,045 B2 * | 5/2011 | Bakalski | ................. H01L 23/66 257/276 |
| 2004/0041634 A1 | 3/2004 | Sugiura | |
| 2005/0236689 A1 * | 10/2005 | Sugiura | ............ H01L 23/49838 257/531 |
| 2012/0146723 A1 | 6/2012 | Blednov et al. | |

* cited by examiner

HIGH FREQUENCY AMPLIFIER

FIELD OF THE INVENTION

This invention relates to a high frequency amplifier and a matching circuit for a high frequency amplifier. The invention further relates to a semiconductor device and to a base station for mobile communications comprising the high frequency amplifier and the matching circuit.

BACKGROUND OF THE INVENTION

High frequency amplifiers are devices that amplify a high frequency signal and transfer the high frequency signal to a load termination. In high frequency power amplifiers the transfer of the high frequency signal is typically done in successive power amplifier stages, wherein each of the successive power amplifier stages has gradually a larger power capability than a preceding power amplifier stage. The transfer of the high frequency signal through each one of the successive power amplifier stages to the load termination must be carefully designed in order not to attenuate part of the high frequency signal, thereby degrading the high frequency power amplifier performance. Optimization of the transfer of the high frequency signal is achieved by impedance matching. Impedance matching matches a source impedance to a load impedance ensuring maximum transfer of power from the source impedance to the load impedance. Impedance matching is sometimes realized with discrete passive components that offer predetermined high frequency characteristics. Alternatively, integrated passive components are used. Impedance matching is typically performed by impedance matching circuits. An example of impedance matching circuits used in high frequency amplifiers is shown on FIG. 1 of U.S. Pat. No. 7,119,623B2. FIG. 1a of this document shows a similar picture found typically in practical prior-art implementations. FIG. 1a shows a MOS device 10 with a gate G, a source S and a drain D terminal. The MOS device of FIG. 1a is connected in a common source configuration in which the source terminal S connected to a reference potential is common to the gate terminal G and to the drain terminal D. The gate terminal G and the drain terminal D are respectively an input and an output for the MOS device 10. The reference potential is a ground reference potential GND. A parasitic inductive path 15 is present between the source terminal S and the ground reference potential GND. The parasitic inductive path 15 may be caused by the presence of a physical distance between the actual source terminal S and the effective location of the ground reference potential GND. A parasitic capacitance Cout is present at the output of the MOS device 10 and connected between the drain terminal D and the source terminal S. The parasitic output capacitance Cout has a negative effect on the MOS device 10 performance by adding a frequency-dependent component to the MOS device 10 output impedance. An impedance matching circuit is therefore connected to the drain terminal D of the MOS device 10. The impedance matching circuit shown in FIG. 1a includes a shunt inductive bondwire BW and a shunt capacitor C. The shunt capacitor C is coupled at one side to a reference potential GNDM which may be slightly different than the ground reference potential GND (e.g. at a different location) and at another side to the series bondwire INDS. The shunt capacitor C is usually integrated in a dedicated die DIEA different from a die DIEB in which the MOS device 10 is integrated. The dedicated die DIEA in which the capacitor C is integrated is indicated by the dashed line in FIG. 1a. The shunt inductive bondwire BW is actually a bondwire that connects the capacitor C to the drain terminal D of the MOS device 10. The shunt inductive bondwire BW provides a parallel resonant circuit together with the parasitic output capacitance Cout during operation at the high frequency of interest. The parasitic output capacitance Cout is therefore effectively compensated by the shunt inductive bondwire BW. The shunt inductive bondwire BW is coupled to the ground reference potential GNDM through a large shunt capacitor C to prevent a DC current through the shunt inductive bondwire BW to flow to the reference potential GNDM. The capacitor C is usually coupled to the reference potential GNDM on the dedicated die DIEA either through diffused sinker connections in the case of a high conductive substrate or through vias in the case of a high resistive substrate. One problem of the latter approach is that the semiconductor technology with which the dedicated die DIEA is fabricated has vias electrically connecting the capacitor C to a ground pad underneath the die (e.g. the ground back metallization of the dedicated die DIEA), thereby reducing an effective thickness of the die substrate that may instead be used to build high quality integrated passive components. Furthermore said semiconductor technology integrating the passive components may be mechanical complex and mechanically weak because the vias through which the dedicated die DIEA is connected to the reference potential GNDM need to be electrically connected to a ground pad underneath the dedicated die DIEA. The electrical connection may be obtained by means of solder balls, conductive epoxy or any other suitable means of attaching the dedicated die DIEA to the ground pad. As said another option to connect the capacitor C to the reference potential GNDM is to make use of a high conductive substrate to make a high conductive connection of the capacitor C to the reference potential GNDM. In this case however there are extra losses associated with the high conductivity of the substrate that degrades the quality factor of the integrated passive components. As a consequence the efficiency of the high frequency amplifier may be seriously compromised by the use of any of the above-mentioned options.

SUMMARY OF THE INVENTION

The present invention provides an integrated matching circuit for a high frequency amplifier transistor and a high frequency amplifier using such integrated matching circuit as is described in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1A:
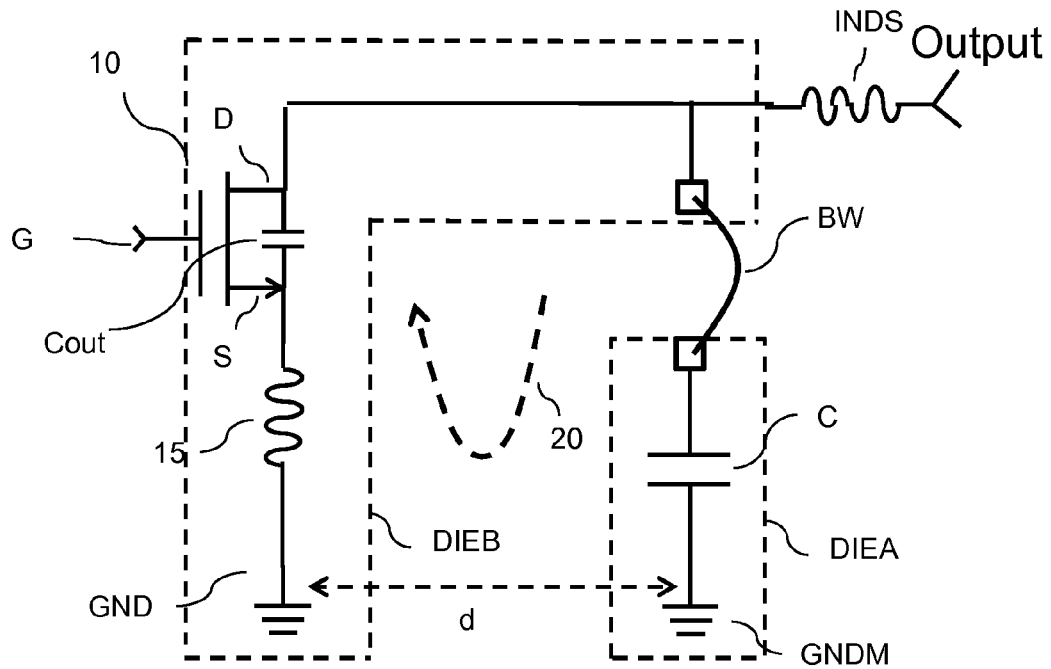
FIG. 1a schematically shows a prior art example of a high frequency amplifier with an integrated matching circuit.
Figure 1B:
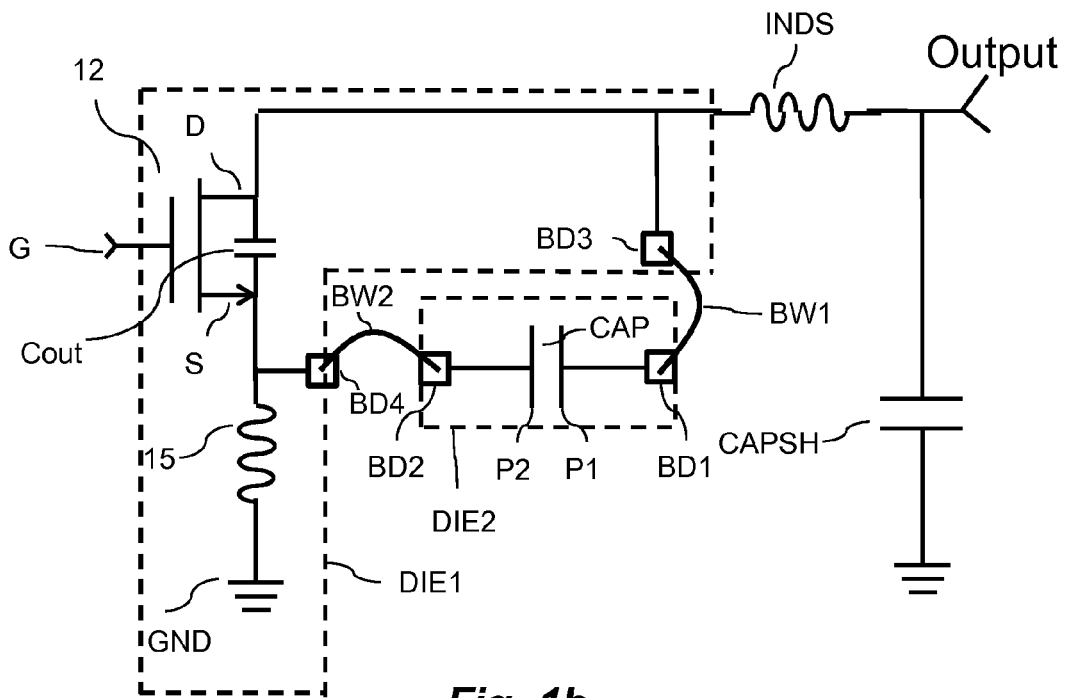
FIG. 1b shows a schematic representation of a high frequency amplifier according to the invention.

FIG. 1b shows a schematic representation of a high frequency amplifier. The high frequency amplifier includes a high frequency amplifier transistor 12 and an impedance matching circuit. The high frequency amplifier transistor 12 of FIG. 1b is a MOS device. The high frequency amplifier transistor 12 may be for example a final stage or an intermediate stage of a high frequency power amplifier. Alternatively the high frequency amplifier transistor 12 may be for example a hetero-junction bipolar transistor (HBJT) or a metal-semiconductor field effect transistor (MESFET). The high frequency amplifier transistor 12 has three terminals: an input terminal G, an output terminal D and a reference terminal S. The input terminal G, the output terminal D and the reference terminal S are respectively a gate terminal, a drain terminal and a source terminal of the high frequency amplifier transistor 12. The reference terminal S is coupled to a reference potential GND via a parasitic inductive path 15. The reference potential GND is typically a lowest available potential for the high frequency amplifier transistor 12, which is normally a ground or earth potential. The high frequency amplifier transistor 12 is configured in a common source configuration in which the reference terminal S is a common reference to the input terminal G and to the output terminal D. The parasitic inductive path 15 represents typically an undesired but unavoidable extra component in the common source configuration of the high frequency amplifier transistor 12. In fact there always exist a physical distance between the reference terminal S and the reference potential GND. This physical distance may for example include a path going through different semiconductor materials of different resistivity. This path traversing different semiconductor materials shows typically a frequency-dependent resistance, i.e. a reactance, similar to a reactance of an inductor. At the high frequency where the high frequency amplifier transistor 12 is operating, which may be in the radio or microwave frequency range, i.e. in the order of several hundreds of megahertz (MHz) to a few gigahertz (GHz), the parasitic inductive path 15 may have a considerable inductive reactance which is not negligible. Therefore, in the present invention, the parasitic inductive path 15 is taken into account in the geometrical design of the high frequency power amplifier. The high frequency amplifier transistor 12 is integrated in a first die DIE1 made of a first semiconductor technology. The first semiconductor technology may be a LDMOS (Lateral Diffused Metal-Oxide Semiconductor) technology or a GaAs (Gallium Arsenide) technology or a GaN (Gallium Nitride) or any other semiconductor technology suitable to integrate the high frequency amplifier transistor 12. The impedance matching circuit shown in FIG. 1b includes a capacitive element CAP in series with a first inductive bondwire BW1 and with a second inductive bondwire BW2. A first plate P1 of the capacitive element CAP is electrically coupled to a first bondpad BD1. The first bondpad BD1 is connected to the drain terminal D of the high frequency amplifier transistor 12 by means of the first inductive bondwire BW1. A second plate P2 of the capacitive element CAP is electrically coupled to a second bondpad BD2. The second bondpad BD2 is connected to the reference terminal S by means of the second inductive bondwire BW2. In FIG. 1b the first and second plates P1 and P2 of the capacitive element CAP are directly connected to the first and second bondpads BD1 and BD2 respectively. As it will be further explained in some other practical layout implementations of the integrated matching circuit, the first and second plates P1 and P2 of the capacitive element CAP may be electrically coupled to the first and second bondpads BD1 and BD2 by means of inductive elements integrated in the second die DIE2. In this last case the first and second plates P1 and P2 are electrically connected to the first and second bondpads BD1 and BD2 by means of the inductive elements integrated in the second die DIE2. The capacitive element CAP is integrated in the second die DIE2 made of a second semiconductor technology different from the first semiconductor technology. The second semiconductor technology has an isolating substrate to isolate conductively the capacitive element CAP from a support PKG at which the second die DIE2 is attached at a first side AS. The support PKG is not shown in the schematic representation of FIG. 1b but it is shown on FIG. 3. The second semiconductor technology may be a standard silicon technology with a high resistivity substrate or with an isolated substrate by means for example of a thick dielectric layer such as $SiO_2$ (Silicon Dioxide) or any suitable semiconductor technology capable to integrate high quality passive components for high frequency applications, e.g. GaAs (gallium arsenide) or LTCC (Low Temperature Co-fired Ceramic). By integrating in the second die DIE2 the series capacitive element CAP, there may be no need for a ground connection in the second die DIE2. At the contrary of the prior-art solution shown in FIG. 1a in which a connection to the reference potential GND is required to connect the shunt capacitive element C to it, in FIG. 1b no connections to the reference potential GND are required in the second die DIE2. In this way a choice of the second semiconductor technology may be limited to less complex and cheaper semiconductor technologies where less process steps may be needed. As said in the introduction, the prior-art solution of FIG. 1a suffers of the fact that by using in the passive die DIEA via connections to the reference potential GND, the thickness of the substrate may be too limited to allow the integration of high-quality passive components. In FIG. 1b such a thickness limit is not present and a thick isolating substrate may be chosen for the integration of the high-quality capacitive element CAP. Furthermore since no electrical connection is anymore necessary between the capacitive element CAP and an area of the package or the board underneath the second die DIE2, the substrate of the second die DIE2 may be chosen with high resistivity to diminish any leakage or losses through the substrate. Consequentially potential parasitic couplings or parasitic components formed between the capacitive element CAP and the reference potential GND may be reduced. In FIG. 1b, the electrical connection to the reference potential GND is instead obtained by means of the second inductive bondwire BW2 that re-uses the reference potential GND connection of the first die DIE1. In this way the design of the high frequency amplifier transistor 12 and of the integrated matching circuit is further simplified. In addition to these considerations, it should be noted that overall assembly of the second die DIE2 into the package or board embedding the high frequency amplifier transistor 12 and the integrated matching circuit may be simplified. In fact the second die DIE2 may be attached to the package or the board without being in electrical contact with it. The second die DIE2 may be for example glued with non-conductive glue at its bottom with the package or board. No solder balls may for example be needed anymore. The impedance matching circuit shown in FIG. 1b is particularly suitable for matching the output impedance of high frequency high power amplifier transistors. High frequency high power amplifier transistors used for example in cellular base station amplifiers need to amplify signal up to a range of tens of watts. Depending on a cellular network standard used and on a spatial coverage needed, output powers generated by such high frequency high power amplifier transistors may reach values exceeding 100 W (or 50 dBm). In order to handle such high output powers, the high frequency high power amplifier transistor needs to be carefully designed to be capable to operate at high currents and voltages. The high frequency high power amplifier transistor is thus typically a large transistor with a large output terminal area designed to handle a large amount of current flowing from the output terminal D to a load impedance. The large output terminal area of the high frequency high power amplifier transistor ensures also more efficient power dissipation. Therefore the high frequency high power amplifier transistor has typically an output impedance characterized by a low output resistance and a large negative reactance (i.e. a capacitive impedance). This large negative reactance is schematically shown in FIG. 1b by a parasitic output capacitance Cout connected between the output terminal D and the reference terminal S of the high frequency amplifier transistor 12. In order to match the output impedance of the high frequency high power amplifier transistor 12 with for example the load impedance, an output matching circuit that compensates for the large negative reactance is needed. The integrated matching circuit shown in FIG. 1b which includes the first and the second inductive bondwires BW1 and BW2 and the capacitive element CAP provides a high pass filter configuration that compensates for the large negative reactance of the high frequency amplifier transistor 12. As mentioned in the background section, the first and the second inductive bondwires BW1 and BW2 represent together a shunt inductor that compensates for the large negative reactance of the high frequency amplifier transistor 12. The capacitive element CAP is a shunt capacitor that needs to block DC currents that may flow through the inductive bondwires BW1 and BW2 towards the reference potential GND. Thus the capacitive element CAP is not functional to the integrated impedance matching circuit but it is only used as a DC-blocking element. As a consequence the capacitive element CAP may be relatively large in order not to affect matching of the integrated impedance matching circuit at the high frequency of interest. By integrating the capacitive element CAP in a dedicated second die DIE2, sufficient area for the integration of a large capacitive element CAP may be provided. The series arrangement of the first and second inductive bondwires BW1 and BW2 with the capacitive element CAP may be considered a pre-matching stage for the high frequency amplifier transistor 12 in which the large negative reactance is compensated. A series inductor INDS is connected at one side to the output terminal D and another side to a signal output terminal Output. The series inductor INDS may part of the pre-matching stage and used in combination with the inductive bondwires BW1 and BW2 and the capacitive element CAP to provide a flat output impedance in the high frequency range of interest (i.e. the operating frequency band of the pre-matching stage). After the pre-matching stage, one or more successive matching stages may be used. Each one of the successive matching stages may be configured as a low pass filter configuration having a series inductive element and a shunt capacitive element respectively. Impedance levels are lower at the pre-matching stage than at the successive matching stages so that power levels and current levels are higher at the pre-matching stage than at the successive matching stages. As a consequence the solution proposed by the inventor prevents that a large feedback voltage across the parasitic inductive element 15 is generated by the large return current RD flowing in the pre-matching stage of the output matching circuit. The disclosed matching circuit may alternatively be used at the input terminal G of the high frequency amplifier transistor 10. In this last case the first plate P1 of the capacitive element CAP is connected to the input terminal G by means of the first bondpad BD1 and the first inductive bondwire BW1. Similar argumentations to the ones already given in describing FIG. 1b are valid for this latter case wherein the series arrangement of the first and second inductive bondwires BW1 and BW2 with the capacitive element CAP is used to compensate for the large negative reactance of the high frequency amplifier transistor 12 present at the input terminal G. As a consequence the integrated matching circuit may be used for example to match an impedance of a previous high frequency amplifier transistor stage to the impedance of the high frequency amplifier transistor 10. This function is normally implemented with a so-called inter-stage impedance matching circuit.

Figure 2A:
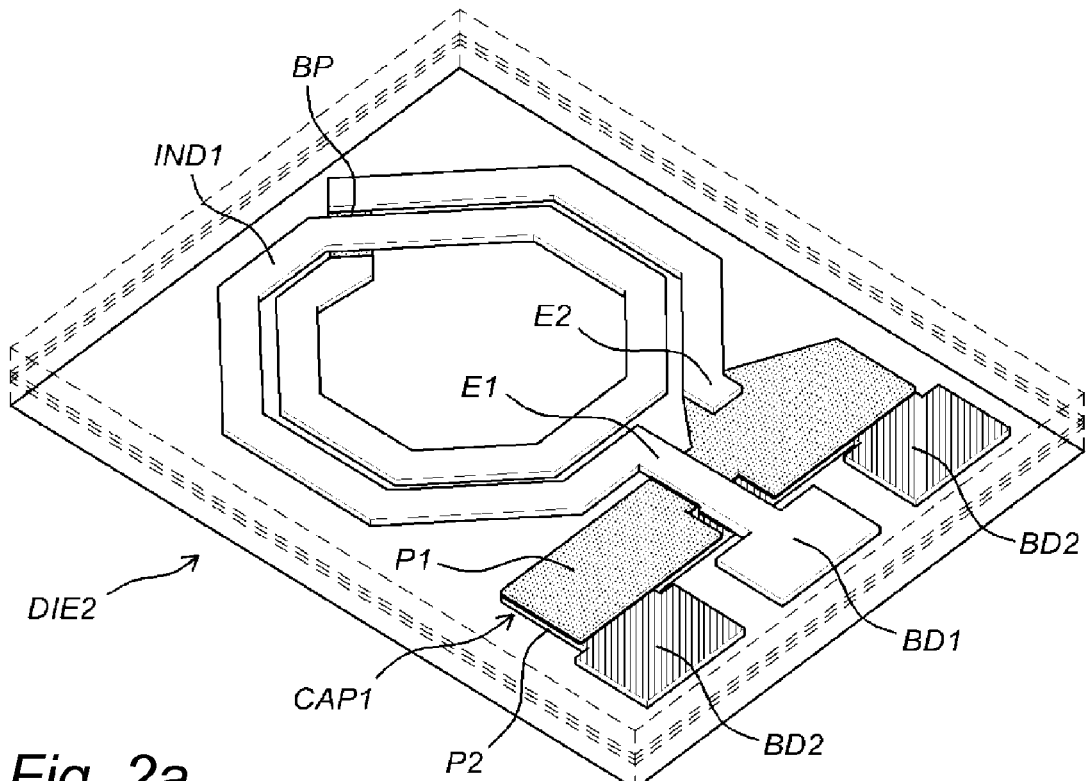
FIG. 2a shows an example of a practical layout embodiment of an impedance matching circuit used in the high frequency amplifier of FIG. 1b.

FIG. 2a shows a practical layout embodiment of the integrated matching circuit. FIG. 2a shows an integrated matching circuit which includes a series arrangement of an inductive element IND1 with a capacitive element CAP1. Both the inductive element IND1 and the capacitive element CAP1 are integrated in the second die DIE2 made of a second semiconductor technology different from the first semiconductor technology with which the first die DIE1 is made and where the high frequency amplifier transistor 12 is integrated. The inductive element IND1 has a planar conductive structure with a first end E1 connected the first bondpad BD1 and a second end E2 connected to the first plate P1 of the capacitive element CAP1. The second plate P2 of the capacitive element CAP1 is connected to the second bondpad BD2. The first plate and the second plate of the capacitive element CAP1 may be made of metal as shown in FIG. 2a. In this case the first plate is located in a metal layer different from the metal layer where the second plate is located. Alternatively the first and second plates of the capacitive element CAP1 may be made of other suitable conductive semiconductor materials of the second semiconductor technology. Another option is to have a metal plate of the capacitive element CAP1 in one layer of the stack of metal layers and another plate in a suitable conductive semiconductor material of the active semiconductor area. A dielectric as for example silicon oxide ($SiO_2$) is used between the two metal plates, the two suitable conductive semiconductor material plates or the metal-suitable conductive semiconductor material plates. The planar conductive structure of the inductive element IND1 may be located in a metal layer above the isolating substrate of the second die DIE2. The metal layer may be part of a stack of metal layers used to connect more passive components together. The metal layer may be a thick metal layer to reduce DC resistance of the inductive element IND1. The thick metal layer may be made by connecting more metal layers of the stack of layers in parallel through for example metal vias.

The inductive element IND1 of FIG. 2a has a planar spiral structure. The planar spiral structure increases a so-called quality factor of the inductive element IND1 which is a measure of the quality of the inductive element IND1 over the high frequency range of interest. The planar inductive structure increases an inductance value of the inductive element IND1 per unit area so that the inductive element IND1 is more compact for the same inductance value. By having a planar conductive structure a distance between the planar conductive structure and a semiconductor substrate of the semiconductor material underneath is maximized. Consequently the planar conductive structure reduces a parasitic capacitance formed between the planar conductive structure and the semiconductor material underneath through which parasitic currents at the high frequency of interest may flow. The semiconductor isolating substrate underneath the inductive element IND1 and the capacitive element CAP1 may preferably be a high-resistivity substrate which further decreases the amount of said parasitic currents, thereby increasing further the quality factor of the inductive element IND1. Since the inductive element IND1 and the capacitive element CAP1 in the second die DIE2 are series component without ground connections, the second die DIE2 does not necessitate any ground connection to a ground pad or ground path eventually situated in a support (e.g. printed circuit board or package) below the second die DIE2 to which the second die DIE2 is attached or soldered. The inductive element IND1 shown in FIG. 2a is a planar spiral structure with two turns. More or less turns may be used to increase or decrease the inductance of the inductive element IND1 in order to achieve the desired inductance value. The desired inductance value may be achieved by tuning length and shape of the first and second inductive bondwires BW1 and BW2 in series with the inductive element IND1 and the capacitive element CAP1. The two turns of the planar conductive structure are connected almost entirely in the same metal layer except for a short by-pass point BP in a different metal layer. This particular planar conductive structure ensures that the turns of the inductive element IND1 are further apart. The effect of having this particular planar conductive structure is to increase a distance between portions of the planar conductive structure carrying a current of opposed direction, thereby decreasing a negative mutual inductance between said portions and increasing the effective inductance of the inductive element per unit length of the inductive element IND1. The particular planar conductive structure of FIG. 2a ensures that the first bondpad BD1 and the second bondpad BD2 are arranged at the same lateral side LS of the second die DIE2, thus minimizing the length of the first and second inductive bondwires BW1 and BW2 connecting said bondpads to correspondent bondpads at the output terminal D and reference terminal S of the first die DIE1 respectively. It should be noted that in the practical layout embodiment of FIG. 2a the first terminal E1 and the second terminal E2 of the inductive element IND1 are arranged at a distance from the respective BD1 and the first plate P1 of the capacitive element CAP1 that is lower than 20% than a total length of the conductive planar spiral structure forming the inductive element IND1. This further ensures that no extra parasitic inductive paths are present between the first end E1 and the first bondpad BD1 and between the second end E2 and the first plate P1 of the capacitive element CAP1.

Figure 2B:
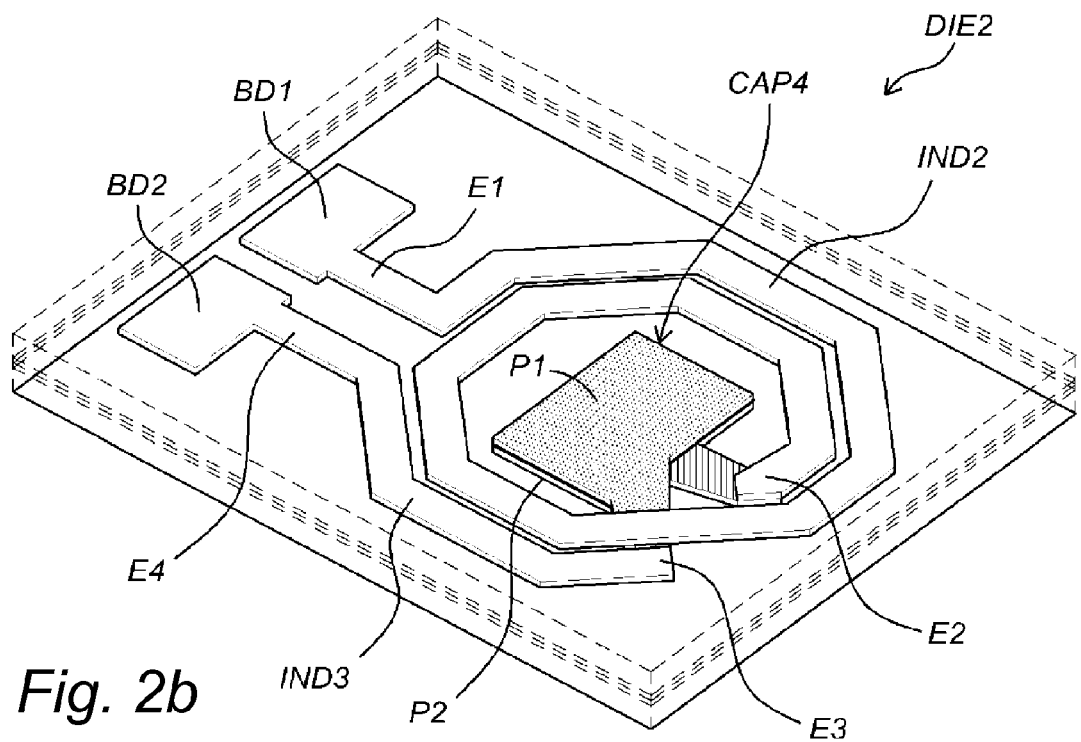
FIG. 2b shows another example of a practical layout embodiment of an impedance matching circuit used in the high frequency amplifier of FIG. 1b.

FIG. 2b shows an example of an additional practical layout implementation of the part of matching circuit integrated in the second die DIE2. In this example the integrated matching circuit includes an inductive element IND2 and a further inductive element IND3 having both a planar conductive structure. The inductive element IND2 has a first end E1 and a second end E2. The further inductive element IND3 has a third end E3 and a fourth end E4. The first end E1 is arranged at the first bondpad BD1 of the series arrangement and the fourth end E4 is arranged at the second bondpad BD2 of the series arrangement. The second end E2 is connected to a first plate P1 of a capacitive element CAP2 and the third end E3 is connected to a second plate P2 of the capacitive element CAP2. The capacitive element CAP2 is arranged in a center area of the planar conductive structure formed by the inductive element IND2 and the further inductive element IND3. This particular practical layout implementation uses the capacitive element CAP2 as a by-pass element for the planar conductive structure formed by the inductive element IND2 and the further inductive element IND3. In other words the planar conductive structure formed by the inductive element IND2 and the further inductive element IND3 acts as a single inductive element. This practical layout implementation is more compact because the centre area of the planar conductive structure formed by the inductive element IND2 and the further inductive element IND3 is used to integrate the capacitive element CAP2. This practical layout implementation may save considerable layout area in the implementation of the matching circuit in the second die DIE2. Moreover similarly to the layout implementation of FIG. 2a, the practical layout implementation of the inductive elements IND2 and IND3 in a top metal layer in series with the capacitive element CAP2 with the first and second plates integrated in metal layers different from the top metal layer, decreases the negative mutual inductance of the inductive elements IND2 and IND3 turns and increases the net inductance of the planar conductive structure. The inductive elements IND2 and IND3 may together form a planar conductive spiral structure similar to the one shown in FIG. 2a. The inductive elements IND2 and IND3 are in series with the capacitive element CAP2 and are connected through bondpads BD1 and BD2 and bondwires BW1 and BW2 to the output terminal D and the reference terminal S of the high frequency amplifier transistor 12 respectively. The inductive elements IND2 and IND3 may be used to finely tune an inductance value of the bondwires BW1 and BW2 respectively. By integrating in the second die DIE2 only the series inductive elements IND2 and IND3 and the series capacitive element CAP2, no ground vias are necessary in the second DIE2 and an isolating substrate is instead used. As already explained, this simplifies the process of making the second semiconductor technology of the second die DIE2 and the assembly of the second die DIE2 in the support (e.g. a printed circuit board or package). The consequence of not necessitating ground vias connected to a ground pad underneath the second die DIE2 is also to increase the quality factor of the passive elements integrated in the second die DIE2.

In another embodiment not shown in the figures the second die DIE2 may be used to integrate a plurality of a series of capacitive elements and/or inductive elements in series with the capacitive element CAP, CAP1 or CAP2 for example. The capacitive element CAP, CAP1 or CAP2 for example is this electrically coupled to the bondpads BD1 and BD2 via the plurality of the series of capacitive and/or inductive elements. This arrangement may be used to achieve a desired value of matching for the matching circuit. The series of the capacitive elements and/or the inductive elements in series with the capacitive element CAP, CAP1 or CAP2 may be integrated all with a high quality factor in the second die DIE2 given that an isolating substrate without ground vias is used in the second die DIE2.

Figure 3:
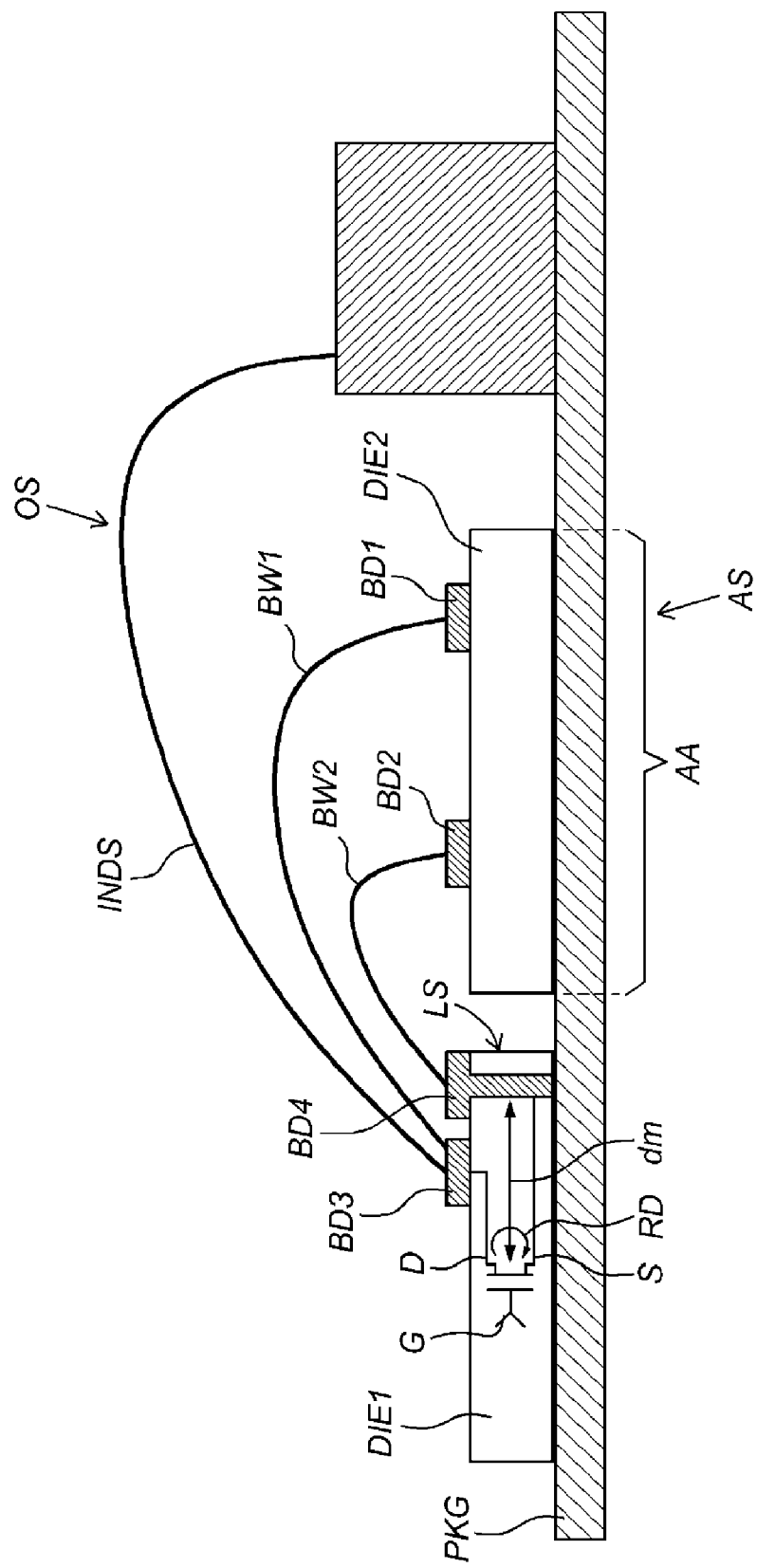
FIG. 3 shows an example of assembling a high frequency amplifier transistor with an impedance matching circuit according to the invention.

FIG. 3a shows a practical assembly implementation of the same high frequency amplifier shown in FIG. 1b with the high frequency amplifier transistor 12 and with any of the described matching circuits. In FIG. 3 the high frequency amplifier transistor 12 shown in FIG. 1b is integrated in a first die DIE1. The part of the matching circuit as shown in FIG. 1b, 2a or 2b is integrated in a second die DIE2. The first die DIE1 is assembled on a same package PKG with the second die DIE2. The capacitive element CAP as described in FIG. 1b may be the only component integrated in the second die DIE2 in which case the shunt inductive element of the pre-matching integrated circuit is formed by the series of the first and second inductive bondwires BW1 and BW2. Alternatively in the case the integrated matching circuit in the second die DIE2 includes the series of the capacitive element CAP1 with the inductive element IND1 of FIG. 2a, the first and the second inductive bondwires BW1 and BW2 may be used to tune the value of the inductance of the inductive element IND1. In the most general case the second die DIE2 may be used to integrate a plurality of a series of inductive and/or capacitive elements, all in series with any of the described capacitive element CAP, CAP1 or CAP2. The second die DIE2 is attached at a first side AS to the package PKG. The second die DIE2 is attached to the package PKG at a bottom area AA of the second die DIE2. Said area AA may be glued to the package PKG. Since no ground vias area necessary in the second die DIE2 to connect the integrated elements in the second die DIE2 to a ground pad of the package at the first side AA, a non-conductive glue instead of conductive glue or solder material may be chosen to attach the second die DIE2 to the package PKG. First and second bondpads BD1 and BD2 are located on top of the second die DIE2 at a second side OS opposite to the first-mentioned attached side AS. The first bondpad BD1 is connected to a third bondpad BD3 of the first die DIE1 by means of the first inductive bondwire BW1. The second bondpad BD2 is connected to a fourth bondpad BD4 of the first die DIE1 by means of the second inductive bondwire BW2. The third bondpad BD3 is conductively connected to the output terminal D of the high frequency amplifier transistor 12 integrated in the first die DIE1. The fourth bondpad BD4 is conductively connected to the reference terminal S of the high frequency amplifier transistor 12 integrated in the first die DIE1. The third bondpad BD3 may be further connected to a further inductive bondwire INDS which connected the output terminal D of the high frequency amplifier transistor 12 to a signal output terminal Output of the package PKG.

In another embodiment still with reference to FIG. 3, the third bondpad BD3 and the fourth bondpad BD4 are arranged at a same lateral side LS of the first die DIE1 to obtain a geometry in which the third bondpad BD3 is adjacent to the output terminal D of the high frequency amplifier transistor 12 and the fourth bondpad BD4 is adjacent to the reference terminal S of the high frequency amplifier transistor 12. The fourth bondpad BD4 is preferably connected directly in proximity of the reference terminal S. In reality the fourth bondpad BD4 is arranged to physically tap a portion of the parasitic inductive path 15 shown in FIG. 1b. In this embodiment the fourth bondpad BD4 taps the parasitic inductive path 15 at a point such that a distance dm between the fourth bondpad BD4 and the reference terminal S is minimized. A current circulating from the output terminal D to the reference terminal S creates a feedback return path for the high frequency amplifier transistor 12 along which a return current RD flows. By minimizing the distance dm, only a portion of the parasitic inductive path 15 is involved in this feedback return path. It should be noted here that the word adjacent means that there are no extra parasitic inductive conductive paths between the third bondpad BD3 and the output terminal D and between the fourth bondpad BD4 and the reference terminal S. In other words, a path starting at the output terminal D and ending at the reference terminal S passing by the series arrangement of the inductive bondwires BW1 and BW2 with the capacitive element CAP should only contain the inductive bondwires BW1 and BW2 in series with the capacitive element CAP and no other extra parasitic elements. This arrangement ensures that the influence on the unwanted feedback of the return current RD flowing from the output terminal D to the reference terminal S is minimized. In the practical layout implementations of the invention, the third bondpad BD3 and the fourth bondpad BD4 are arranged in close proximity to each other in the first die DIE1. The distance dm creates a parasitic inductive path common to the output terminal D and the reference terminal S used by the return current RD to generate an undesired output to input feedback. In the solution provided in FIG. 1b with the practical assembly shown in FIG. 3 in which the third and fourth bondpads are arranged at the same lateral side LS of the first die DIE1 to obtain the geometry of the described embdodiment, the generated undesired output to input feedback is effectively smaller than an undesired output to input feedback generated by the prior art solution of FIG. 1a. In FIG. 1a the return current 20 must flow from the output terminal D to the reference terminal S via the entire parasitic inductive path 15 and via a further parasitic inductive path determined by a distance d between a reference potential GNDM of the impedance matching circuit and a reference potential GND of the MOS device 10. Since the total parasitic inductive path from output to input shown in FIG. 1a is larger than the total parasitic inductive path from output to input in the geometry of the described embodiment, the influence of the return current 20 shown in FIG. 1a on the output to input feedback is also larger than the influence of the return current RD for the geometry of the described embodiment. The total parasitic inductive path acts as a current to voltage converter for the output to input feedback. When the total parasitic inductive path is larger, the return current 20 flowing into the total parasitic inductive path generates a larger voltage that is transferred to the input. Said in other words, the fourth bondpad BD4 may be physically connected as closely as possible to the reference terminal S in order to eventually reduce the distance dm to zero and the third bondpad BD3 and the fourth bondpad BD4 may be arranged as close as possible to each other at the same lateral side LS of the first die DIE1 in order to eventually reduce as much as possible the influence of the return current RD.

In another exemplary embodiment the high frequency amplifier includes a further high frequency amplifier transistor (not shown in the Figures). The high frequency amplifier transistor and the further high frequency amplifier transistor may be placed in one same package. The same package may be of the same type shown in FIG. 3. The high frequency amplifier transistor and the further high frequency amplifier transistor may be LDMOS devices. Each of the high frequency amplifier transistors may be integrated in a separated first die DIE1 of a first semiconductor technology with portion of the correspondent matching circuit integrated in a separated second die DIE2 of a second semiconductor technology as shown in FIG. 1b and FIG. 3. Alternatively both of the high frequency amplifier transistors may be integrated in the same first die DIE1 and/or both of the portions of the correspondent matching circuits may be integrated in the same second die DIE2. The correspondent portion of the matching circuit integrated in the second die DIE2 may be part of one of the input impedance matching circuit or of the output matching circuit of each of the high frequency amplifier transistors. The high frequency amplifier transistor and the further high frequency amplifier transistor may be arranged in a Doherty amplifier configuration. The Doherty amplifier configuration is well known in the art and it is typically used for high frequency power amplifiers. The Doherty amplifier configuration uses two high frequency amplifier transistors operating at different regimes in order to optimize an overall efficiency of the high frequency power amplifier. The Doherty amplifier configuration requires that the two high frequency amplifier transistors operate as independent units without cross-coupling. In particular a cross-coupling involving a common parasitic inductive path connecting the reference terminals of both the high frequency amplifier transistor and the further high frequency amplifier transistor may be particularly dangerous for stability and efficiency degradation. When the Doherty amplifier is build based on two high frequency amplifier transistors with any of the previously discussed matching circuit that share the same transistor package (e.g. similar to the package PKG shown in FIG. 3) assembly of the Doherty amplifier may be simplified and high quality factor passive elements may be integrated in the second die DIE2, thereby increasing efficiency of the Doherty amplifier. Further to that if the arrangement of the bondpads in the first die DIE1 in which each or both of the high frequency amplifier transistors is or are integrated is such to minimize the parasitic inductive path common to the output terminal D and to the input terminal G of each of the high frequency amplifier transistors, each of the high frequency amplifier transistors may act as an isolated high frequency amplifier transistor. As previously discussed, this may be achieved if in each of the high frequency amplifier transistors the third bondpad BD3 and the fourth bondpad BD4 are close to each other and if a geometry in which the distance dm between the fourth bondpad BD4 and the reference terminal S is minimized. In such case the return current RD is isolated in each of the high frequency amplifier transistors and a feedback through the common parasitic inductive path is minimized. Furthermore when the output to input series feedback via the common parasitic inductive path is strong, the input impedance of each of the high frequency amplifier transistors may change as a function of the input power levels applied to the input terminal G of the high frequency amplifier transistor. As a consequence it becomes difficult to match the input impedance of the high frequency amplifier transistor for a range of frequencies that is bigger than 10% than the high frequency of interest without sacrificing the gain of the Doherty amplifier configuration. By reducing as explained the common parasitic inductive path between the two high frequency amplifier transistors, the isolation between the input terminal G and the output terminal D is improved and a broader band performance, i.e. within more than 10% bandwidth, of the Doherty amplifier configuration may be achieved. It should be noted that the high frequency of interest depends on the application in which the high frequency amplifier or the Doherty amplifier configuration is used. The high frequency of interest may be the operating frequency of wireless communication systems such as for example GSM, EDGE, WCDMA, LTE, etc, i.e. in the radio frequency range.

A semiconductor device may include the high frequency amplifier so far described. The semiconductor device may include a package (e.g. similar to the package PKG shown in FIG. 3) in which the high frequency amplifier transistor or the high frequency amplifier transistors are mounted.

Any of the previously discussed high frequency amplifier or semiconductor devices may be implemented in a base station for mobile communications such as 3 G or 4 G mobile communications standards in which high efficiency radio frequency power amplifiers are required.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Other modifications, variations and alternatives are also possible. The specifications and drawings are, accordingly, to be regarded in an illustrative rather than in a restrictive sense. In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that an arrangement of these measures cannot be used to advantage.

The invention claimed is:

1. A high frequency amplifier comprising a high frequency amplifier transistor integrated in a first die of a first semiconductor technology and a matching circuit, the high frequency amplifier transistor comprising an input terminal, an output terminal and a reference terminal coupled to a reference potential, the matching circuit comprising:
   at least a first inductive bondwire and a second inductive bondwire, and
   a capacitive element arranged in series with said inductive bondwires, the capacitive element being integrated in a second die of a second semiconductor technology different from the first semiconductor technology, the second semiconductor technology comprising an isolating substrate for conductively isolating the capacitive element from a support that is attached to a first side of the second die, the capacitive element comprising a first plate electrically coupled to a first bondpad of the second die, the first bondpad being connected to the input terminal or to the output terminal by the first inductive bondwire element, and a second plate electrically coupled to a second bondpad of the second die, the second bondpad being connected through the first die to the reference terminal by the second inductive bondwire element, the first and second bondpads being arranged at a second side of the second die opposite to the first side.

2. A high frequency amplifier as claimed in claim 1 wherein the matching circuit further comprises an inductive element comprising a planar conductive structure with a first end and a second end, the first end being connected to the first bondpad and the second end being connected to the first plate of the capacitive element.

3. A high frequency amplifier comprising a high frequency amplifier transistor integrated in a first die of a first semiconductor technology and a matching circuit, the high frequency amplifier transistor comprising an input terminal, an output terminal and a reference terminal coupled to a reference potential, the matching circuit comprising:
   at least a first inductive bondwire and a second inductive bondwire,
   a capacitive element arranged in series with said inductive bondwires,
   the capacitive element being integrated in a second die of a second semiconductor technology different from the first semiconductor technology, the second semiconductor technology comprising an isolating substrate for conductively isolating the capacitive element from a support that is attached to a first side of the second die, the capacitive element comprising a first plate electrically coupled to a first bondpad of the second die, the first bondpad being connected to the input terminal or to the output terminal by the first inductive bondwire element, and a second plate electrically coupled to a second bondpad of the second die, the second bondpad being connected to the reference terminal by the second inductive bondwire element, the first and second bondpads being arranged at a second side of the second die opposite to the first side,
   a first inductive element comprising a planar conductive structure with a first end and a second end, and
   a second inductive element comprising another planar conductive structure with a third end and a fourth end, wherein the first end and the fourth end are connected to the first bondpad and the second bondpad respectively, the second end and the third end being connected to the first plate and to the second plate of the capacitive element respectively, the capacitive element being arranged in the centre area of the planar conductive structure formed by the first inductive element and the second inductive element.

4. A high frequency amplifier according to claims 2 wherein the planar conductive structure of the inductive element is a planar spiral structure.

5. A high frequency amplifier according to claim 2 wherein the inductive element is integrated together with the capacitive element in the second die and is conductively isolated from the support by the isolating substrate.

6. A high frequency amplifier according to claim 3 wherein the first inductive element and the second inductive element are integrated together with the capacitive element in the second die and are conductively isolated from the support by the isolating substrate.

7. A high frequency amplifier according to claim 1 wherein the first and second plates of the capacitive element are electrically coupled to the first and second bondpads by a series arrangement of a plurality of capacitive elements, inductive elements, or capacitive and inductive elements integrated in the second die and are electrically isolated from the support by the isolating substrate.

8. A high frequency amplifier according to claim 1 wherein the first die further comprises a third bondpad and a fourth bondpad configured to connect the first inductive bondwire and the second inductive bondwire respectively.

9. A high frequency amplifier according to claim 8 wherein the third bondpad and the fourth bondpad are arranged at a same lateral side of the first die to obtain a geometry with the third bondpad adjacent to the input terminal or to the output terminal and the fourth bondpad adjacent to the reference terminal.

10. A high frequency amplifier according to claim 1 wherein the isolating substrate is a high resistivity substrate.

11. A high frequency amplifier according to claim 1 wherein the isolating substrate is an isolated substrate.

12. A high frequency amplifier according to claim 1 wherein the high frequency amplifier transistor is selected from a laterally diffused metal oxide semiconductor (LDMOS) power transistor, a gallium arsenide (GaAs) transistor, and a gallium nitride (GaN) transistor.

13. A high frequency amplifier according to claim 1 comprising a further high frequency amplifier transistor and a further matching circuit arranged for matching the further high frequency amplifier transistor wherein the high frequency amplifier transistor and the further high frequency amplifier transistor are arranged in a Doherty amplifier configuration.

14. A high frequency amplifier according to claim 8 wherein the third bondpad and the fourth bondpad are adjacent to each other and a distance between the fourth bondpad and the reference terminal is tuned to obtain a matching within a frequency band which is larger than 10% of an operating frequency of the high frequency amplifier.

15. A high frequency amplifier according to claim 1 wherein an operating frequency of the high frequency amplifier is in a radio or microwave frequency range.

16. A semiconductor device according to claim 1 further comprising a package, wherein the package contains the high frequency amplifier.

17. An amplifier device comprising:
   a support;
   a first die with a first surface, a second surface opposite the first surface, first, second, and third bondpads at the first surface of the first die, a ground pad on the second surface of the first die, a conductive path through the first die between the third bondpad and the ground pad, and an integrated transistor, wherein the transistor includes an input terminal electrically coupled to the first bondpad, an output terminal electrically coupled to the second bondpad, and a reference terminal electrically coupled to the ground pad, and wherein the ground pad is coupled to the support; and
   a matching circuit that includes
      a second die with a first surface and a second surface, wherein the second surface of the second die is coupled to the support,
      a capacitive element with a first plate and a second plate,
      a fourth bondpad at the first surface of the second die and electrically coupled to the first plate of the capacitive element,
      a fifth bondpad at the first surface of the second die and electrically coupled to the second plate of the capacitive element,
      a first inductive bondwire connected between the fourth bondpad and either the first or second bondpad, and a second inductive bondwire connected between the fifth bondpad and the third bondpad to provide a conductive path between the second plate of the capacitive element and the ground pad through the fifth bondpad, the second inductive bondwire, the third bondpad, and the conductive path through the first die.

18. The amplifier device of claim 17, wherein:
the first die of a first semiconductor technology; and
the second die is of a different technology from the first semiconductor technology, wherein the different technology is selected from a high resistivity semiconductor substrate, an isolated semiconductor substrate, and low temperature co-fired ceramic.

19. The amplifier of claim 18, wherein:
the second die includes an isolating substrate.

20. The amplifier of claim 17, wherein:
the second die includes a high resistivity substrate.

21. The amplifier of claim 17, wherein:
the first die includes a high conductive substrate, and the conductive path through the first die between the second bondpad and the ground pad includes a diffused sinker.

22. The amplifier of claim 17, wherein:
the first die includes a high resistivity substrate, and the conductive path through the first die between the second bondpad and the ground pad includes a through via.

\* \* \* \* \*